United States Patent [19]

Duncan

[11] 4,250,471
[45] Feb. 10, 1981

[54] CIRCUIT DETECTOR AND COMPRESSION-EXPANSION NETWORKS UTILIZING SAME

[76] Inventor: Michael G. Duncan, 300 Walnut St., Clinton, Tenn. 37716

[21] Appl. No.: 901,421

[22] Filed: May 1, 1978

[51] Int. Cl.³ .............................................. H04B 1/64
[52] U.S. Cl. .................................. 333/14; 307/264; 307/351; 328/26; 328/34
[58] Field of Search .................. 307/351, 264, 237; 328/26, 34; 333/14

[56] References Cited

U.S. PATENT DOCUMENTS

| | | | |
|---|---|---|---|
| 3,735,290 | 5/1973 | Yamazaki | 333/14 |
| 3,760,282 | 9/1973 | Arnold et al. | 307/351 X |
| 3,885,168 | 5/1975 | Matsuzaki | 307/351 |
| 3,939,365 | 2/1976 | Lindgren | 307/351 |

*Primary Examiner*—Paul L. Gensler
*Attorney, Agent, or Firm*—Pitts & Kesterson

[57] ABSTRACT

This invention discloses new and unique detectors suitable for controlling any device needing precise conversion of AC voltage to an equivalent DC voltage. The detector may also be used as an excellent non-linear low pass filter. More particularly, the detector is suitable for controlling meter movements and the variable gain amplifiers which are used in compressors, expanders, compandors, limiters and other noise reduction systems. The detectors control gain such that unnecessary gain changes are eliminated, overshoot transient distortion is minimized, distortion due to ripple is minimized, and pumping is eliminated. As described herein, the detector uses two interacting memories to provide a output signal from the detector which can be used to drive a variable gain amplifier for achieving optimum characteristics of a compressor, expandor or compandor. This is achieved by using inter-connecting circuitry between the two memories and between the inputs and outputs of the detector such that one of the memories dominates and controls the output signal for most input voltage situations, but in the event of drastic input signal changes the second memory interreacts with the first memory.

26 Claims, 20 Drawing Figures

CIRCUIT DETECTOR AND COMPRESSION-EXPANSION NETWORKS UTILIZING SAME

BACKGROUND

1. Field of the Invention

This invention relates to tape, disc, broadcasting and other sound information systems, and to solutions of the problems associated with noise reduction and the inherent limit of the dynamic range of such systems. The basic problem with respect to dynamic range of certain systems originates because of the difference in the dynamic range of the human ear which has a range of approximately 130 db. whereas tape, disc, and broadcast system usually have a dynamic range of less that 70 db. However, the problem isn't simply one of inadequate dynamic range of the sound reproduction system, it is further complicated by the fact that the human ear is a nonlinear device and therefore if the average level of a sound is reproduced different from that of the original sound, then the balance of gain between high and low frequencies is upset. As an example, if a recording is played back at a level lower than that of the original sounds, then the recording of the bass tones will sound deficient. Therefore, it will be appreciated that if a recorded sound is not reproduced at the same sound level as the original sound then some of form of compensation is necessary if the recorded reproduced sound is going to be asthetically pleasing to the listener. Of course, it is not essential that a sound be asthetically pleasing if the intelligence to be communicated is contained only in the words. However, if the reproduced sound is primarily for the purpose of the music then it is obvious that the asthetic qualities of the reproduced sound are of the utmost importance.

As is well known by those skilled in the art, each of the various sound reproduction systems have specific types of noise problems. Of course, simple frequency dependent fixed filters could be used to reduce the noise if the intelligence to be communicated was contained solely in the spoken word. Unfortunately, fixed filters will remove both signal and noise having a frequency in its operating range. Therefore, such filters cannot be used to eliminate noise in systems used for the reproduction of music as the reproduced signal would be audiably degraded.

More particularly, therefore, this invention relates to a new and unique detector suitable for controlling the variable gain amplifiers which are used in compressors, expandors, limiters and other noise-reduction systems. The invention also relates to new and unique designs of such compressors, expandors, compandors, limiters and noise-reduction systems which provide superior performance by making optimum use of the new and unique detector.

2. Discussion of the Prior Art

Dynamic range reduction and expansion systems as well as noise reduction systems fall into complimentary and noncomplimentary systems. The complimentary system minimizes distortion of the signal and is therefore the preferred method for high accuracy and sophisticated systems.

In a complimentary system, the signal is processed (compressed) before recording, and then processed again (expanded) during the playing of the recording, so as to substantially restore the signal to its original state. The dynamic range of a substantial portion of the sounds generated by live entertainment, musical performances and other recordings, etc., which are ultimately heard by the human ear is frequently well in excess of that of any available recording medium. For purposes of this application the term dynamic range means the difference in decibels between the overload level of the system receiving the signal and the minimum signal level that can be received and processed by the system. Typically, human hearing is considered to have a dynamic range of approximately 130 decibels whereas the live performance of a large symphony orchestra will easily exceed 100 decibels. Under ideal circumstances, the best recording and broadcasting systems could have a dynamic range of close to 100 decibels for a selected pure tone. Unfortunately, the typical dynamic range of a system, is usually no better than 60 to 70 decibels for complex signals which contain many tones no matter whether the medium is tape, disc, etc. Consequently, it will be appreciated that an obvious solution might be to reduce the dynamic range of the signal being recorded by lowering the peak value of the signal below the upper limit of the recording medium and to increase the softer sounds so as to make them significantly louder than the noise. This is called compressing the dynamic range. A signal having a compressed dynamic range can then be recorded on the recording medium without excessive distortion. When the recorded and compressed signal is later "played back", the louder peaks are returned to their original level and the softer passages are again made softer. Thus the dynamic range of the recorded signal is expanded, and may then be amplified or otherwise made available to the human listener. Devices which can compress, expand, or both compress and expand are referred to as compressors, expandors, and compandors, respectively and represent a portion of the subject matter of this invention.

Signal compression by various means occurs universally in the broadcasting and recording industry. For example, during a broadcast or recording session the engineer may simply manually change the system input levels for any number of reasons. This type of dynamic range compression is commonly called "gain riding". In addition, circuits in the system may be employed to prevent the input volume from exceeding a selective level to avoid overmodulation. This type of dynamic range compression is called "limiting". It will be appreciated that the compressed program can be expanded back to its original dynamic range only if the expandor is exactly complimentary to the compressor. That is, the expandor must expand only those portions of the signal that were compressed and it must expand them precisely to the original level. Normally, in the case of "gain riding" or "limiting" the compression parameters are not known and therefore exactly complimentary expansion is not achieved. However, even in this type of operation, a general expander can be used to restore some of the dynamics, particularly if the parameters of the compressor can be adjusted so as to closely approximate the complimentary parameters of the compression system employed.

If the signal is compressed without later being complimentary expanded the sound reproduction system is what is known as a "non-complimentary" system. In other words, the reproduced signal would not be identical to the original.

In addition to its ability to compress and expand the dynamic range of a signal, the compandor, as will be discussed hereinafter, may also be used as a superior noise reduction system. However, it will be apreciated, that any noise reduction system employed in commercial broadcasting and recording industries must be standardized so that the recording may be played back through a complimentary system. Furthermore, any such compandor should produce listenable results when played back without complimentary expansion. This means, that expansion would not always be necessary for certain types of intelligence communication; however, if high fidelity was a major factor then the expansion could be performed and the performance restored substantially to its original dynamic range.

In a very general sense, all compandors (compressors, expandors) limiters and noise reduction systems consist of a variable gain amplifier responsive to a detected signal. Therefore, it will be appreciated that an essential element in all of these systems is a suitable detector for supplying the control signal which drives the variable gain amplifier. Therefore, a new and unique detector, suitable for use in superior compandors, limiters and noise reduction systems also represents the subject matter of this invention.

Various prior art detectors are discussed in more detail hereinafter. In particular, U.S. Pat. No. 2,585,890 issued to H. Wolfe; U.S. Pat. No. 3,187,268 issued to B. B. Bauer, and U.S. Pat. No. 3,260,957 issued to A. Kaiser; and a master's thesis submitted by the applicant of this invention disclose detectors which have a hold time (Th) in addition to attack time (Ta) and a decay time (Td). As used herein, the attack time Ta is defined as the time required for the detector output to come within 36.8% of its final value with a step input signal. For detectors not having a hold time, Th, the decay time Td, is defined as the time required for the detector output to drop to 63.2% of the final value and output for a sudden drop in input signal level. However, for systems having a hold time the sum of the decay time and hold time (Td+Th) is defined as the time required for the detector output to drop to 63.2% of its final change in output for a sudden drop in input signal level. The hold time, Th, is defined as the time the output remains constant after a drop in input level. If a detector has only an attack time and a decay time, the detector output will begin to change immediately after an input is removed. Then, if the input is applied again, detector output changes again. To reduce ripple caused by low frequency inputs, the decay time, Td, can be increased. Increasing Td when the detector is used in a compressor, limiter, expandor or noise reduction system minimizes the distortion and excessive gain changes. Unfortunately, a long Td is contrary to noise masking requirements. A long Ta will result in overshoot and is therefore incompatible with the requirements of a noise reduction systems. On the other hand if the attack time, Ta, is made short enough to prevent overshoot and Td is long, transient signals such as impulse noise or signals with high crest factors will cause a reduction of gain of the compressor or limiter (conversely and increase in gain of an expandor) for a substantial period of time after the change in the signal.

The addition of a hold time factor in a detector causes the output of the detector to remain constant for a time Th after a decrease in input signal level. If the input is increased back to its formal level within time Th, the detector output remains constant. But, if the input remains at the reduced level, the detection output decays with a time constant of Td after time Th has elapsed since the decrease of the input signal level. As a way of illustration, assume that Th is 50 milliseconds and Td is 100 milliseconds. If a full wave rectified sine wave of frequency greater than 10 Hz is applied to the input of the detector, the time between input signal peaks will be less than 50 milliseconds; hence, there will be no ripple in the detector output.

Subjectively, systems employing a short Ta and Td and a zero Th have been described as causing compressed sounds to sound distorted, full, muddy, or over-reverberant. On the other hand, if Td is made too long compressed music tends to sound slightly flat, empty or hollow.

Therefore, it can be seen that the detection system is very important since if affects Ta, tracking accuracy between expandor and compressor, and the listenability of compressed signals. The three types of detection presently available include peak detection as shown in prior art FIG. 1; true RMS detection as shown in FIG. 2; and true average detection, as shown in FIG. 3.

The output signal of a peak detector as is illustrated in FIG. 1 seeks the peak value of the input signal, and if the attack time, Ta, is short enough, the resulting output signal of the peak detector will increase to a level equal to the peak value of the input signal. A simple peak detector always has Ta less than the decay time, Td. As shown in FIG. 1, an input signal is received at input point 90 by a rectifying circuit 91 shown here as diode 92. Although a single diode 92 is illustrated it will be appreciated that a full wave rectifier would be even more preferable. The output of rectifying ciruit 91 is then applied to a non-linear smoothing filter 93A shown here as capacitive element 92 and resistive element 95. In the example illustrated in FIG. 1, which is for positive voltages, the smoothing filter is a low pass filter with a high cut-off frequency when the input signal is greater than the detector output Vo at point 96, and the filter has a lower cut-off frequency when the input signal is less than Vo.

The prior art RMS circuit detector of FIG. 2 includes squaring circuit 97 for squaring the input voltage received at point 90. Squaring circuit 97 is illustrated here as a multiplier circuit wherein both inputs to the multiplying circuit are the input voltage received at input point 90. Multiplication circuits of this type are commercially available. The output of squaring circuit 97 is then applied to linear low pass filter 93B (shown here as a resistive element 98 and a capacitive element 94 which is connected to ground) which provides a running time average output. The running time average output from low pass filter 93B is then applied to a division circuit 99 which uses the output at point 96 as the denominator of divider 99. Thus the square root of the running time average signal from filter 93 is obtained, and is by definition the RMS value of the input signal Vin received at input point 90. An RMS detector has a faster attack time, Ta, than its decay time, Td, and due to the square root operation, Ta and Td are dependent on the change in the input signal level.

The prior art average magnitude detector shown in FIG. 3 is very similar to the peak detector of FIG. 1 and differs substantially only in that smoothing filter 93B is linear. Therefore, the attack time, Ta, is equal to the decay time, Td. With many signals, the average magnitude is approximately equal to the RMS value. However, in practice the RMS value is usually slightly higher than the average magnitude value for an equivalent attack time, Ta. If the attack times, Ta, are equal, a peak detector provides the highest output value. Although some rather simplified detector circuits have been illustrated, it will be appreciated that commercial circuits which achieve these results are readily available and it is not necessary that they be built up from discrete components. For a more detailed discussion of such detector circuits, the reader is referred to T. H. Shingold's book entitled, "Non-Linear Circuits Handbook, Designing with Analog Functioning Modules and Ic's; 1976". The book is published by Analog Devices, Inc. of Norwood, Mass.

Because the ear determines loudness by the power of the signal, a RMS or an average peak detector will result in a more listenable compressed signal. In addition, RMS and average detection can sometimes result in better compandor tracking as RMS detection is insensitive to time delay distortion in the channel, while average detection is less susceptible to this distortion than peak detection, and RMS detection is more sensitive than the average detection to channel frequency response limitations. Unfortunately, good averaging requires that Ta be much longer than the period of the wave form. However, the most severe time delay distortion for transients occurs at high frequencies. But if a long Ta is employed, overshoot on compression of high level transient sounds will require the use of the limiter if clipping is to be avoided. Unfortunately, once a signal has been clipped or limited it cannot be restored by the expander as was discussed heretofore. An additional problem with RMS and average detection is that loud signals with high crest factors can easily overload the channel. Hence, it is apparent that best results will be obtained with RMS or average detection on all signals except those with high crest factors or high level transients where peak detection must occur.

The audibility of dropouts due to peak detection is strongly affected by Td and Th. The dropouts of any depth are inaudible if they last for no more than 10 milliseconds. This indicates that when peak detection is necessary, Td plus Th should be reduced to 10 millisec- onds or less. This characteristic of a fast Ta and Td can be realized by taking the time derivative of the output of the average detector and adding this to the direct output of the average detector.

Of the various compandors systems that have been designed in an attempt to solve the problems of dynamic range, the so called "Dolby Systems" are perhaps the most successful. Dolby's approach set out in U.S. Pat. No. 3,631,365 which issued to Ray M. Dolby of London, England, compresses and expands various bands of the frequency spectrum individually.

Other U.S. patents issued to R. M. Dolby as an inventor or co-inventor which are related to the present invention include the following: U.S. Pat. No. 3,029,306 entitled Video Recording System and Method and Processing Amplified Network; U.S. Pat. No. 3,665,345 entitled Compressors and Expandors for Noise Reduction Systems; U.S. Pat. No. 3,737,678 entitled Limiters for Noise Reduction Systems; U.S. Pat. No. 3,760,102 entitled Level Setting in Noise Reduction Systems; U.S. Pat. No. 3,775,705 entitled Compressors and Expander Circuits having Control Network Responsive to Signal Level in Circuit; U.S. Pat. No. 3,818,244 entitled Limitors for Noise Reduction Systems; U.S. Pat. No. 3,828,280 entitled Compressors, Expanders and Noise Reduction Systems; U.S. Pat. No. 3,875,537 entitled Circuits for Modifying the Dynamic Range of an Input signal; and U.S. Pat. No. 3,865,416 entitled Signal, Compressors and Expandors. Although none of these Dolby inventions solve the problems in the unique and successful fashion as does the present invention.

A classical wide-band compandor system sometimes referred to as "The Burwen's Noise Eliminator" is described in U.S. Pat. No. 3,732,371 issued to R. S. Burwen.

Other Burwen patents related to the problem solved by the present invention include U.S. Pat. No. 3,678,416 entitled Dynamic Noise Filter having Means for Varying Cut-Off Point; and U.S. Pat. No. 3,753,159 entitled Variable Band Pass Dynamic Noise Filter. These last two patents being directed specifically to the noise filter problem whereas U.S. Pat. No. 3,732,371 discussed above is directed toward a compandor.

Still another classical wide-band compandor system is that described in U.S. Pat. No. 3,789,143 an issued to David E. Blackmer.

Other patents assigned to D. E. Blackmer include U.S. Pat. No. 3,681,618 entitled RMS Circuits with Bipolar Logarithmic Convertor and U.S. Pat. No. 3,714,462 entitled Multiplier Circuits. The Audimax TM system developed by CBS is widely employed in the broadcasting industry as a broadband compressor. Aspects of the Audimax TM system are described in U.S. Pat. No. 3,187,268 to B. B. Bauer; U.S. Pat. No. 3,260,957 to A. Kaiser; and U.S. Pat. No. 3,496,481 to E. Torick.

A compandor circuit also used by CBS and disclosed under U.S. Pat. No. 3,197,712 issued to Bauer entitled "Signal Compressor and Expander Apparatus" and U.S. Pat. No. 3,230,470 issued to Arther Kaiser and entitled "Compressor and Expander Apparatus".

Other patents assigned to CBS related to this field include U.S. Pat. No. 3,529,244 issued to Emil Torick and entitled "Method and Apparatus for Frequency Sensitive Amplitude Limiting"; and U.S. Pat. No. 3,582,964 issued to E. Torick et al, entitled "Automatic Loudness Controller".

Other compandor techniques are disclosed in U.S. Pat. Nos. 3,757,254 and 3,795,876 issued to Nobvaki Takahashi et al. Still another compandor system is described in U.S. Pat. No. 3,815,039 issued to Kiyoji Fujisawa et al and entitled "Automatic Noise Reduction System".

Still other patents related to specific aspects to this invention but not disclosing a compandor as such, include U.S. Pat. No. 3,206,556 to W. S. Bachman; U.S. Pat. No. 3,379,839 to J. H. Bennett; U.S. Pat. No. 3,238,457 to B. R. Boymel; U.S. Pat. No. 3,757,255 to J. P. Jarvis; U.S. Pat. No. 3,535,550 to G. S. Kang; and U.S. Pat. No. 2,585,890 to H. Wolfe.

Whereas all of the above listed and described patents attempt to solve the problems of dynamic range none of them succeeds in producing such asthetically pleasing recordings as do compandors using the new and unique detection of the present invention.

Experimental research effort related to this invention was the subject matter of a thesis by the applicant submitted to the Graduate Counsel of the University of Tennessee and entitled "Design Criteria of a Universal Compandor for the Elimination of Audible Noise in Tape, Disc and Broadcast Systems". Although the thesis which was published in December of 1974 is related to the present invention, it does not disclose, much less teach the solutions achieved by the new and unique detector circuitry of this invention.

SUMMARY OF THE INVENTION

Since the results achieved by a compressor, expander, compandor and other devices needing precise AC voltage to DC voltage conversion is substantially affected by performance and sensitivity of the detectors which drive a variable gain amplifier, it is of the utmost importance that the selected detector provide those control signals necessary to reduce noise, avoid distortion due to over-modulation and ripple, and still provide astheti- cally pleasant sound reproduction. Therefore, it is an object of this invention to provide a detector that avoids unnecessary gain changes, minimizes transient and overload distortion, and minimizes distortion due to ripple.

It is a further object to provide a detector with an optimum attack, hold and release time.

It is also an object to provide a detector that can selectively be made responsive to peak characteristics, average magnitude characteristics, RMS characteristics and a combination of these characteristics.

This and other objects of the present invention are obtained by providing a detector responsive to an electrical source signal which controls the variable gain amplifier. The detector comprises a first memory which receives and continuously stores the input signal. The input signal is provided to the memory by a directional conducting circuit connected between the input of the circuit and the first memory means. The directional conducting circuit typically comprises a unidirectional conductor such as a diode which is in an electrical parallel arrangement with a resistive element. The circuit also includes a second memory which receives an input signal which is proportional to the input electrical source signal. This second memory also includes an output connection point for providing the signal that controls the variable gain amplifier. The second directional conducting circuit is connected between the input point from which the proportional electrical source signal is received and the second memory. The second directional conducting circuitry also includes a diode and resistors arranged in the same manner as the first directional conducting circuit. It should be noted at this point that the time constant for the first memory is typically much shorter than that of the second memory. It would not be unusual for the second memory to be at least 10 times greater than the decay time of the first memory. A third unidirectional conductor connected between the first and second memories provides interaction between the two. The interaction operation is such that the stored values of the first and second memories operate substantially independent of each other and vary only in response to their respective input signals if the stored signal value of the first memory is equal to or larger than the stored signal value of the second memory. However, if the stored signal value of the first memory decreases to a value substantially equal to that of the second memory and if the input electrical source signal is less than the stored value of the second memory then the two memories vary together as though they were a single memory.

DESCRIPTION OF THE INVENTION

Figure 1:
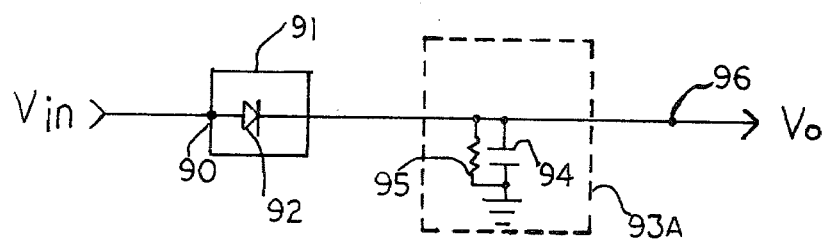
FIGS. 1, 2 and 3 represent circuit examples of a prior art peak detector, RMS detector and an average magnitude detector respectively.
Figure 2:
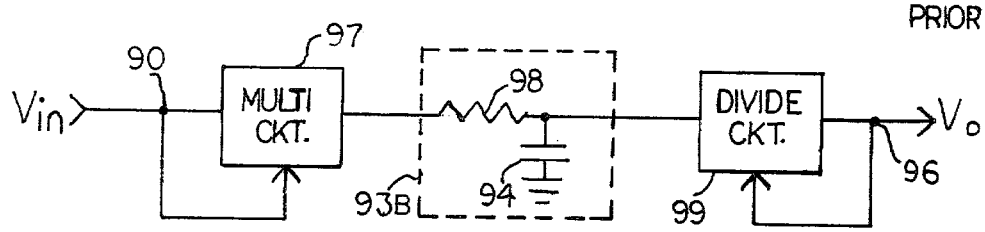
Figure 3:
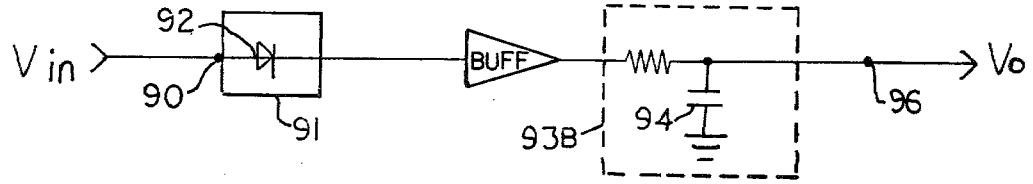
Figure 4:
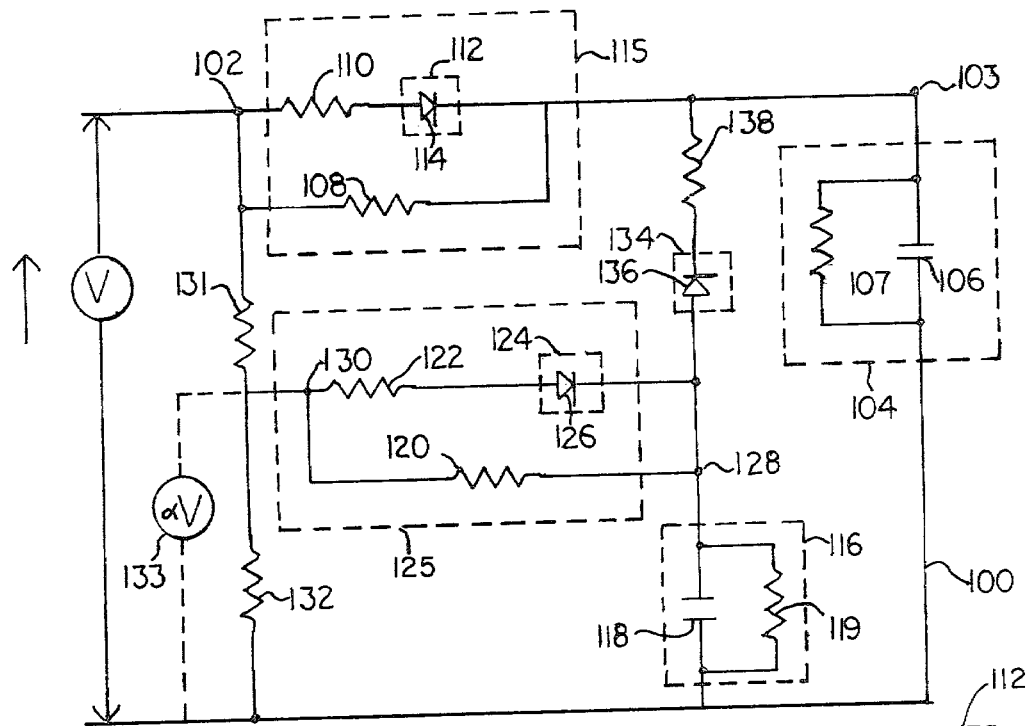
FIG. 4 is a circuit diagram of a preferred embodiment of the detector of this invention.
Figure 4A:
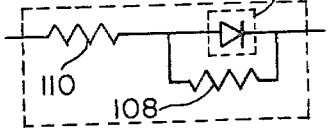
FIG. 4A shows an alternate embodiment of a directional circuit as used in this invention.
Figure 7:
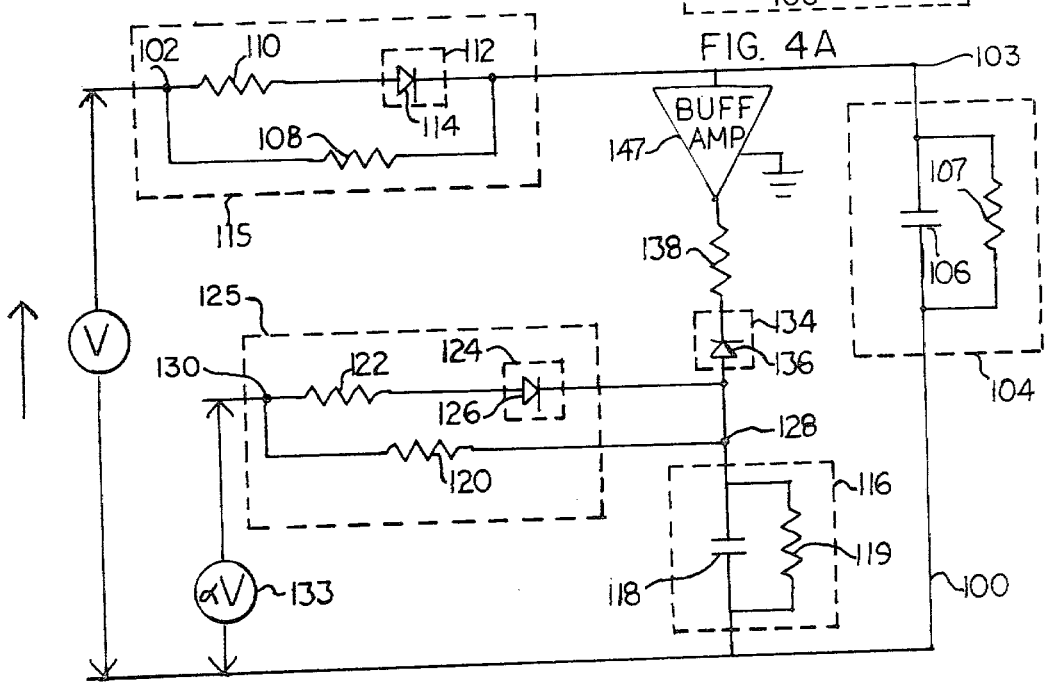
FIG. 7 is a circuit diagram of another preferred embodiment of the detector of this invention which is similar to that of FIG. 4 but also includes a buffer amplifier.

Referring now to FIG. 4, there is illustrated the new and unique detector of this invention. For purposes of the following explanation it will be assumed that all voltages are initially at 0. Therefore, when a positive step input or voltage V is applied to the detector 100 at input point 102, the voltage at point 103 representing the voltage across memory device 104, shown here as capacitor 106 and resistor 107, will begin to increase to the value of the step voltage applied at point 102 through the combination of resistor 108 in parallel with resistor 110 and unidirectional conductor 112 shown here as diode 114. Said combination will be referred to hereinafter as directional conduction circuit 115. The resistance resulting from the parallel combination of elements 108, 110 and 112 results in the voltage across memory device 104 being slightly less than that at input 102 since memory device 104 will always include some degree of leakage current as is represented by high resistor path 107. Memory device 116, shown here as capacitor 118 and resistor 119 is charged through the combination of resistor 120 in parallel with resistor 122 and unilateral conductor 124 shown here as diode 126 such that the output voltage of the circuit at voltage point 128 is substantially equal to the voltage at 130. The combination of resistors 120 and 122 and unidirectional conductor 124 is hereinafter referred to as directional conducting circuit 125. As was the case with directional conducting circuit 115 and memory device 104, the resistance of directional conducting circuit 125 results in the circuit output voltage across memory device 116 being slightly less than the input voltage at point 130, if the memory device has some degree of leakage current through high resistance path 119. It will be appreciated by those skilled in the art that by selection of unidirectional conductors 112 and 124 to have particular resistance, resistor 110 of directional conduction circuit 115 and resistor 122 of directional conduction circuit 125 could be omitted. Alternately, parallel resistors 108 and 120 could be connected in electrical parallel arrangement across their respective unidirectional conductors, and resistors 110 and 122 connected in series with the appropriate parallel combination of the unidirectional conductor and resistor as is shown in FIG. 4A. It should be understood at this point that the voltage at voltage point 130 is preferably proportional to the voltage applied at 102, and that such proportionality may be achieved by the use of a voltage divider across voltage point 102 as is represented by resistor 131 and resistor 132. Alternately, such a proportional voltage could be generated by an independent voltage source 133 as is illustrated by the dashed lines or as is shown in FIG. 7.

Moreover, voltages at points 102 and 130 can be independent. For instance, both voltages could be derived from the same signal via different detectors such as RMS and peak detectors. Due to different detector characteristics, the two voltages at points 102 and 130 may not be proportional for all signals although they may be for certain steady state signals. Furthermore, the two voltages may be completely independent. An example of this use is when voltage 102 is used as a gating signal to override voltage 130.

Although the detector of this invention is discussed with respect to an input voltage at 102 which varies as a step function, it will be appreciated that such step functions represent a worse case condition, and typically the voltage will not change at such a drastic rate. In addition, it should be appreciated that the input signal applied at input points 102 and 130 may represent signals from several sources which have been combined by means of "OR" gates or summation circuits. Typical analog "OR" gates and summation circuits suitable for this purpose will be discussed hereinafter.

It will be appreciated that memory devices 104 and 116 although shown as capacitors may take the form of any variety of other memory devices such as inductors, delay-line circuits, computer memory, etc., which have a voltage current relationship that depends both upon the present and/or past voltage or current. So long as the voltage across memory device 104 is higher than that across memory device 116, unidirectional conductor 134 shown here as diode 136 is reversed bias and does not conduct. That is, there is negligible interaction between the two memory devices 104 and 116. Now, if the voltage at 102 is reduced but only to a level which is still above that at circuit output voltage point 128 then neither diodes 112, 126, nor 136 will conduct since memory device 104 can only discharge down to the voltage at 102 and consequently the voltage across memory device 116 will remain substantially constant since as will be discussed hereinafter the discharge rate of memory device 116 through resistors 119 and 120 will be selected to be much slower than that of memory device 104. It will be appreciated that resistor 119 is of a very high resistance value and although some conductance will occur, the value the current is so low that it may be ignored. When the voltage at 102 decreases to a value below that of memory device 116 neither unidirectional conductor 112, 126, nor 136 will conduct. But Memory device 104 (capacitor 106) will begin to discharge through resistor 107 and resistor 108 (to the reduced level of applied voltage V). If the voltage input at 102 then returns to a voltage level above that of memory device 116 before capacitor 106 discharges to a value less than that across memory device 116 then the output voltage across memory device 116 will remain substantially constant. However, if the voltage at 102 does not increase to a value above that across memory device 116 in time, memory device 104 (capacitor 106) will continue to discharge through resistors 107 and 108 until the voltage at point 103 decreases to a value below the voltage across memory device 116. Once capacitor 106 discharges to such a lower level, unidirectional conductor 134 (diode 136) will begin to conduct through resistor 138 allowing memory device 116 (capacitor 118) to also discharge through resistors 107, 108, 119, 120, and 138. Memory devices 104 and 116 will then each continue to discharge until the voltage at point 103 falls below the voltage at input point 102 and unilateral conductor 112 again begins to conduct. Once unilateral conductor 112 begins to conduct, the voltage across memory device 104 will stabilize substantially at the voltage at input point 102, and the circuit output voltage across memory device 116 will stabilize at a voltage which is also lower, but which is still in the same proportion to the voltage across memory device 104. Thus, it is seen, that any time the voltage across memory device 104 falls below that of memory device 116 the two memory devices interact since the devices are connected by resistor 138 and unidirectional conductor 134.

Figure 5:
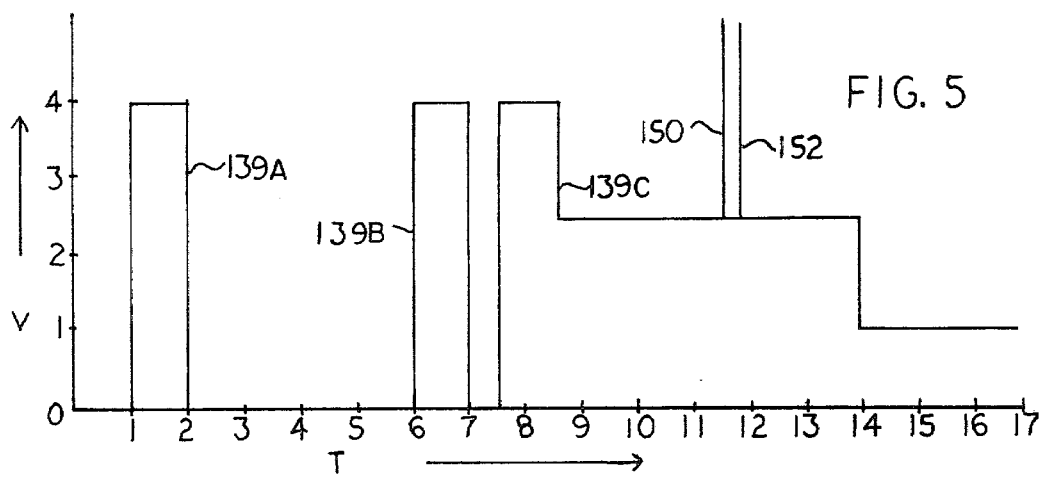
FIGS. 5 and 6 are timing diagrams of voltage levels at selected points of the circuit of FIG. 4.
Figure 6:
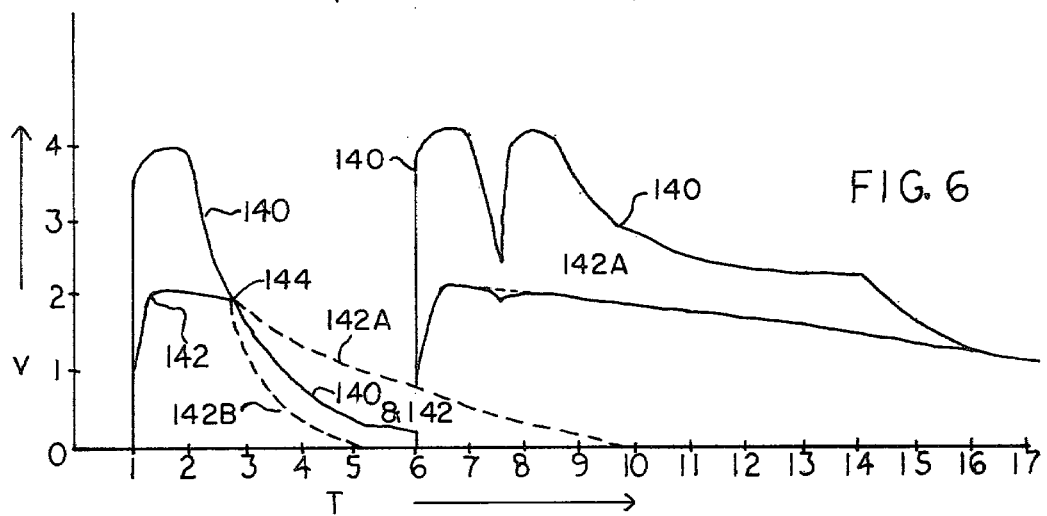

Referring now to FIGS. 5 and 6 in combination with FIG. 4, a typical operation of the detector will be explained. In this example, memory device 116 and 104 are capacitors as is illustrated at 106 and 118 in FIG. 4 and curve 139 of FIG. 5 represents the hypothetical voltage V applied to input point 102. The vertical coordinate labeled "V" is in volts, and the horizontal coordinate labeled "T" represents time. The units of time of the horizontal coordinate are chosen to equal the discharge time constant for memory device 104. This discharge time is approximately computed by obtaining the product of the resistance 108 and capacitor 106 where resistance 108 is much smaller than resistance 107, and the reverse biased resistance of diode 114. Both FIGS. 5 and 6 have identical coordinates of voltage and time. Curve 140 of FIG. 6 represents the voltage across memory device 104, and curve 142 represents the voltage output of the circuit which is also the voltage across memory device 116. As will become clear from the following discussion, curve 142A represents the circuit output voltage that would exist across memory device 116 if there was no interaction whatsoever with memory device 104, curve 142B represents the circuit output voltage across memory device 116 if a buffer amplifier were included between memory devices 104 and 116 as shown in FIG. 7. In this example, the input voltage of point 130 of FIG. 4 is one-half that applied at input point 102. Therefore, if at time T1 as shown by curve 139A a step voltage of 4 volts is applied at input 102, capacitor 106 will begin to charge up to 4 volts as is shown by curve 140. At the same time capacitor 118 will begin to charge up to 2 volts as is shown by curve 142. In this particular example, the attack times of memory devices 104 and 116 are assumed to be approximately equal. More specifically, the attack time across memory device 104 is approximately equal to the sum of resistor 110 and the forward resistance value of diode 114 times the capacitance value of capacitor 106. Similarly, the attack time across memory device 116 is the sum of the resistance of resistor 122 and the forward resistance value of diode 126 times the capacitance value of capacitor 118. It is also assumed here that resistors 108 and 120 are so large that they may be neglected in computing the attack times of memory devices 104 and 116. However, even though resistors 108 and 120 are large enough to be ignored in computing attack time they may still be selected so much smaller than the leakage resistances 107 and 119 of memory devices 104 and 116 themselves, respectively, that the transfer characteristics for steady state signals may be considered linear. It should also be appreciated that resistors 108 and 120 are very important in achieving linearity of the circuit, since without these resistors the non-linear resistance of diodes 114 and 126 would dominate and cause non-linearity of the circuit. Detector linearity is of the utmost importance in compressors, expanders, compandors, and meter movements. In this example, as is shown by curve 139A the voltage at input point 102 instantaneously drops to zero at time T2. Hence, as is shown by curve 140, voltage across memory device 104 begins to decay towards zero at time T2 with a time constant of 1 time unit. Also at time T2 as is shown by curve 142 of FIG. 6, memory device 116 begins to decay toward 0 according to its own time constant. In this example the decay time constant of memory device 116 is arbitrarily selected to have a value, of 10 time units. This discharge time is approximately the product of resistance 120 and capacitor 118 where resistance 120 is much less than both resistance 117 and the reverse biased resistance of diode 126. However, it should be appreciated that the decay time constant of memory device 116 could be substantially greater than 10 time units. This decay will continue until the voltage across memory device 104 falls below that of memory device 116. As is shown by FIG. 6, at the point in time when the voltage across memory device 104 falls below that of memory device 116 as shown at point 144, diode 136 will begin to conduct through resistor 138 such that the voltage across memory devices 104 and 116 are approximately equal. It will be appreciated that the period between T2 and the time of point 144 represents Th as was discussed heretofore. For this to be the case, of course, the forward resistance of diode 136 must be very low as must the resistance of resistor 138. In this example, it has been assumed that the capacitance of capacitor 118 is comparable to that of capacitor 106 and consequently, once diode 136 begins to conduct, the voltage across memory devices 104 and 116 will decay with a time constant larger than one time unit as is indicated by the solid line curve labeled 140 and 142. On the other hand, if the capacitance of capacitor 106 is substantially larger than that of capacitor 118 or if as is shown in FIG. 7 a buffer amplifier 147 is placed in series with resistor 138 and capacitor 106 then the voltage across memory devices 104 and 116 will continue to decay together the time constant of approximately 1 time unit as it is shown by dash curve 142B.

As shown by curve 139B, at time T6, the voltage across input point 102 again rises rapidly to 4 volts and the voltage across memory device 104 and the circuit output voltage across memory device 116 again returns to 4 volts and 2 volts, respectively. At time T7, curve 139B shows that the voltage, drops to 0 for half a time unit and then returns to 4 volts. Thus, as can be seen between the times T7 and T8 the voltages across memory device 104 decays with a time constant of 1 time unit toward 0 as is shown by curve 140 but then increases to 4 volts before the voltage across memory device 104 has a chance to fall below the voltage still present across memory device 116, i.e. 2 volts. Therefore, the output voltage across memory device 116 remains essentially at 2 volts. Thus, it can be seen that a short drop out of voltage at input 102 (which as an example might be caused by a tape drop out if the detector were being used in a compandor) will have minimum effect on the circuit output voltage across memory device 116. Thus, as an example, if an expandor is designed to have its gain proportional to the voltage across memory device 116 of detector 100, it can be seen that the gain of the expandor will drop rapidly for a large drop in input signal value only if the input signal remains at a low value for a significant period of time. Therefore, a rapid decay time is available when necessary for noise masking, but at the same time the system will prevent unnecessary gain changes and errors due to temporary dropouts.

At time T8, as is shown by curve 139C, the voltage at input point 102 drops to a value which, however, is still greater than half of its previous value. In the example shown by curve 139C in FIG. 5, the voltage at 102 drops to approximately 2.4 volts. Thus, in this example the voltage across memory device 104 will decay from 4 volts toward 2.4 volts with a time constant of 1 time unit. However, since the input voltage at input point 102 dropped to only 2.4 volts, the voltage across memory device 104 will remain higher than the voltage across memory device 116. Therefore, diode 136 remains reversed bias and the voltage across memory device 116 can only discharge through resistor 120 disregarding leakage resistor 119 and therefore slowly decays from 2 volts toward 1.2 volts with a time constant of 10 time units. Now, as is shown at a time period between times T11 and T12, the 2 impulse noise spikes as shown at 150 and 152 will have little or no effect on the voltage across either memory device 104 or 116 since the duration of the spikes is substantially less than the attack time of the detector. At time T14, curve 139C shows the operation of the detector when the voltage at input point 102 falls slightly below the voltage across memory device 116. In this situation, the circuit output voltage across memory device 116 will decay after the voltage at point 103 falls below that at point 128 with a time constant of one time unit and then slow down its rate of decay to a time constant of 10 time units.

Figure 8:
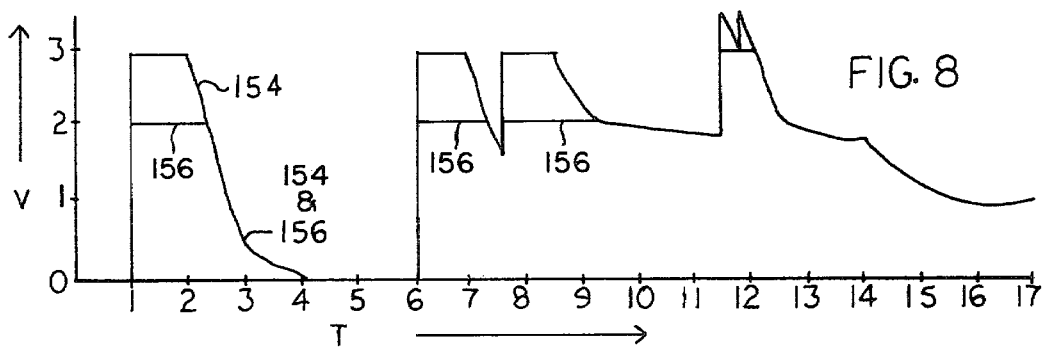
FIG. 8 is another timing diagram of voltage levels at selected points of the circuit of FIG. 4 wherein different input voltages are applied to the circuit and the attack times have been made shorter and the decay time longer.

In the example illustrated by FIG. 8, voltage input 130 is no longer one half the voltage at input point 102. Rather, in this example, the input voltage at point 102 is 2.8 volts rather than 4 volts and the voltage at input 130 is 2 volts as it was in the previous example. So it can be seen that the voltage in this example at input point 130 is a substantial larger percentage of the voltage input at 102. If we assume voltage input at 102 follows the same time pattern as was shown in FIG. 5 by curves 139A, 139B and 139C it will be appreciated that the curve 154 represents the voltage across memory device 104 and curve 156 represents the circuit output voltage across memory device 116. In the example of FIG. 8, it is seen that the attack times of the memory devices are shown as being faster than the shortest transient input, and the decay times are half that shown in FIG. 6. Typically, this would be accomplished by reducing the value of the capacitors 106 and 118 and at the same time reducing the resistors 110, 108, 120 and 122 or employing precision unilateral conductors 114 and 126 with high forward bias conductance. The fast rise time eliminates overshoot in compressors and limiters. For example, as is shown by curves 154 and 156 memory devices 104 and 116 are responsive to the impulse noise spikes 150 and 152 due to the fast attack time. It should be noted however, that the voltage across memory device 116 does not change significantly between the two impulses. This means that in a compressor, etc., gain would not change between closely spaced impulses and thereby distortion would be minimized. However, after a short delay, in this example approximately 0.2 time units, both the voltage across memory device 104 and memory device 116 will decay with a time constant of one-half of a time unit towards a voltage value of 1.68 volts. Or as is shown at time T7, curve 156 representing the circuit output voltage across memory device 116 is also affected by the dropout since the hold time is shorter than the dropout duration.

It will also be appreciated from the above discussion, that the described detector of this invention also operates as an excellent non-linear low-pass filter.

Figure 12:
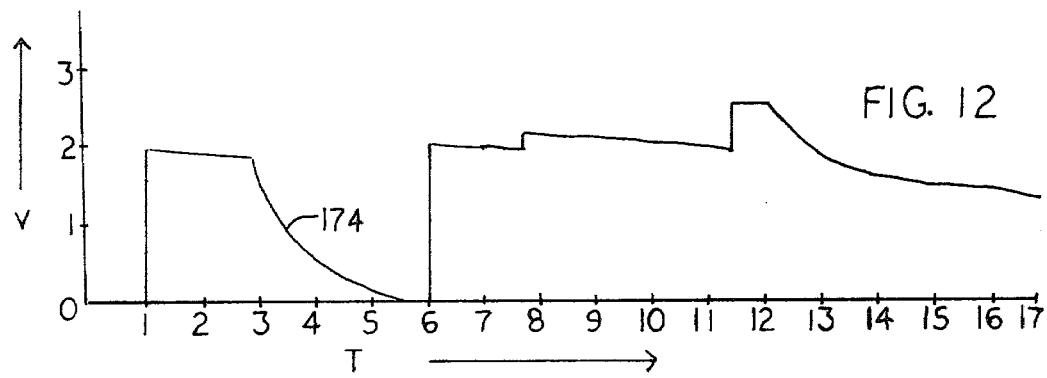
FIG. 12 is a timing diagram of the output voltage of a detector combination of the type shown in FIG. 9 or 10 wherein the performance of one of the detectors is similar to that of FIG. 6 and the other is similar to the performance of the detector of FIG. 8.
Figure 9:
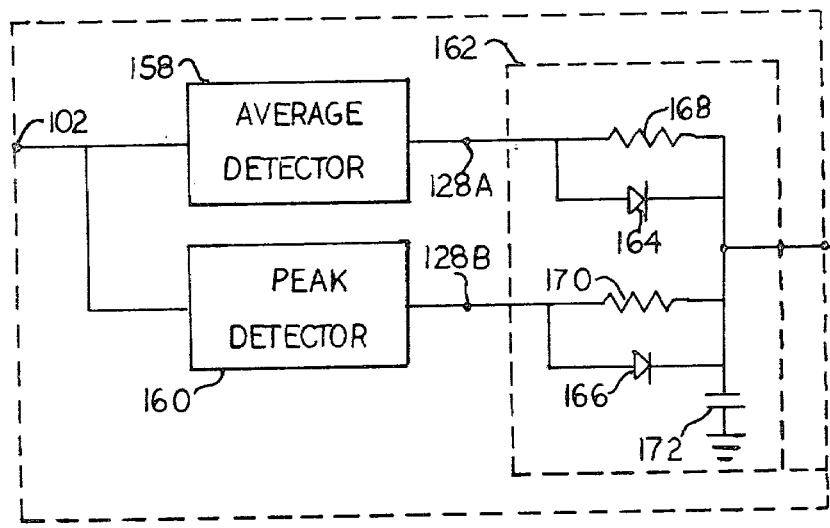
FIGS. 9, 10 and 11 are partial block diagrams showing how two or more of the detectors of this invention can be combined to achieve even greater performance.
Figure 10:
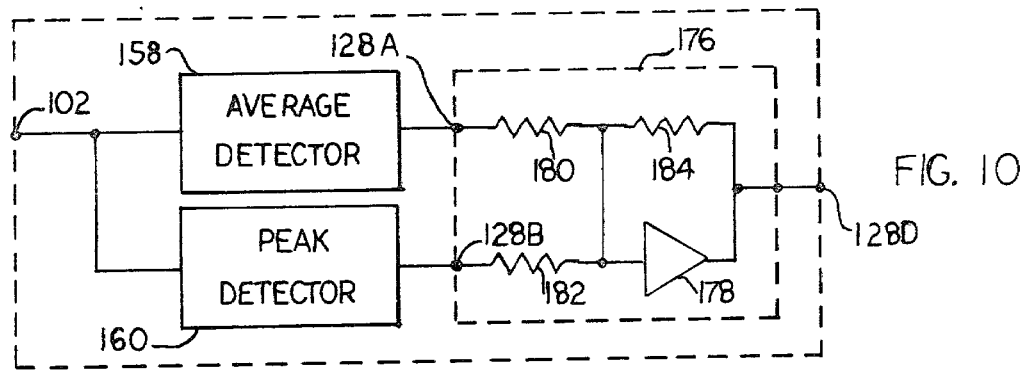
Figure 11:
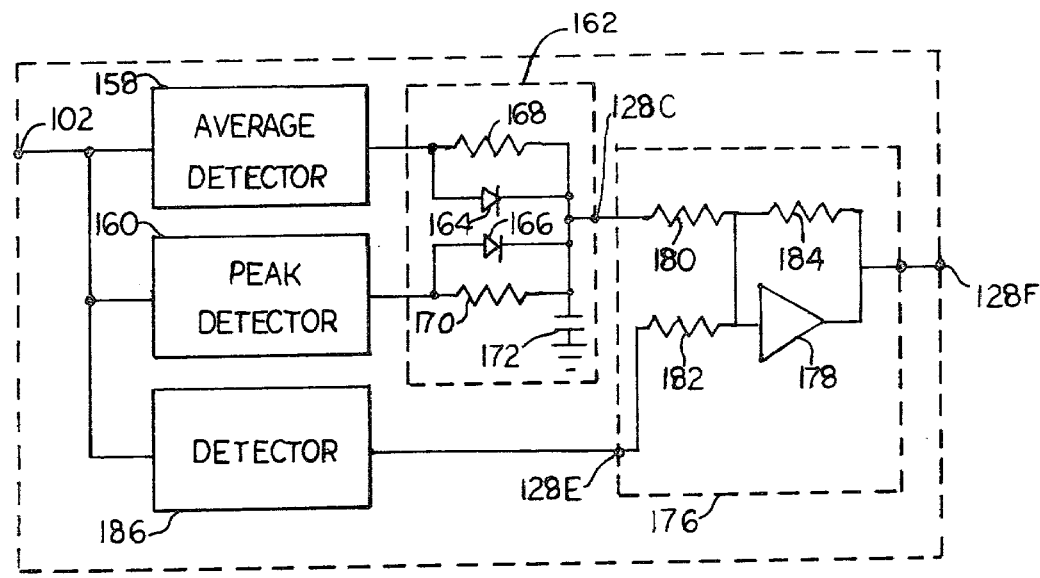

In most devices for which the detector of this invention will be utilized, it is desirable that distortion be minimized, that there be no channel overload, and that the circuit be insensitive to low level impulse noise, be phase insensitive and that the compressed or limited signal sound as natural as possible and that the circuit mask all noise. If channel overload is to be prevented, input memory devices 104 and 116 must be responsive to the peak value of the signal. This of course requires that a fast attack time be employed. However, to minimize phase sensitivity requires that memory devices 104 and 116 be responsive to the RMS or average magnitude of the signal. This of course, requires that the attack be long due to the necessary averaging time. Furthermore, insensitivity to impulse noise also requires a long attack time. A similar contradiction exists with respect to the hold time of greater than 25 milliseconds for audio wave forms down to 20 Hz. But to prevent audible dropouts due to fast peak detection in a compressor or limitor, the sum of the hold time Th and decay time Td must be less than approximately 10 milliseconds. Therefore because of the contradictive requirements it is obvious that all of the above ideal characteristics of a detector cannot be met in a single detector—not even the new and unique detector of this invention. However, one or more detectors may be combined such that they operate in a manner which meets the above mentioned requirements. Techniques for combining detectors of the type heretofore discussed are shown in FIGS. 9, 10 and 11. Referring now to FIG. 9 there is shown detector 158 and detector 160 each of which is a new and unique detector of this invention such as was discussed heretofore with respect to FIG. 4 or FIG. 7. Detectors 158 and 160 are then connected to an Analog "OR" circuit 162. "OR" circuit 162 may be built according to any standard design wherein the output of "OR" circuit 162 is determined according to the highest input received from the two inputs. As is shown in FIG. 9, the input voltage V is still applied to input point 102 of the detector as it was with the single detector discussed with respect to FIG. 4. However, in this combination detector, the voltage received at input 102 is applied to both detectors 158 and 160. In the example as shown in FIG. 9, detector 158 is an averaging detector. That is, it is responsive to the average peak value, average magnitude, or the RMS value of the received input signal, whereas detector 160 is responsive to the instantaneous peak values of the received signal. This means of course that detector 160 should have a very fast attack time. As an example, the sum of Th plus Td should have a value approximately on the order of 10 milliseconds. Detector 158 on the other hand should have a longer attack time Ta, a longer hold time Th, and a longer decay time Td to prevent distortion and gain modulation. As examples only, typical values for these parameters are Ta no less than 2 milliseconds, Th no less than 50 milliseconds, and Td equal to value between 75–100 milliseconds. As was discussed with respect to FIG. 4, the output of the detector is at point 128, which represents the voltage across memory device 116. In the combination embodiment of FIG. 9 the output of averaging detector 158 is shown as 128A, and the output of instantaneous peak detector 160 is shown as 128B. These outputs are then combined by Analog "OR" circuit 162 to provide a combination detector output which is shown again as 128C. Analog "OR" circuit 162 as shown in FIG. 9 comprise two diodes 164 and 166 each being parallel with a companion resistor 168 and 170. The parallel combination of diode 164 and resistor 168 is connected to the output of average detector 158 and the final output of the combination detector 128C. Similarly, the parallel combination of diode 166 and resistor 170 is connected to output of peak detector 160 and the output 128C. Thus it is seen that both detector 158 and 160 will contribute to the final output of the combination detector at point 128C. Capacitor 172 is connected between output point 128C and ground. Resistors 168 and 170 provide linearity to the circuit and a discharge path for capacitor 172. Capacitor 172 is selected such that its decay time is at least as fast as the decay time of the fastest of the two detectors (158 and 160). In the example of FIG. 9, it is desirable that the output of detector 160 normally be equal to or less than the output of detector 158. This is especially true with respect to continuous tones so that detector 158 will dominate the output or circuit except for those signals which have high crest factors or very fast transits. Referring now to FIG. 12 curve 174 represents the output for circuit 162 of the combination detectors shown in FIG. 9 wherein the output of average detector 158 is the same as that shown in curve 142B on FIG. 6 and the output of peak detector 160 is the same as that shown by curve 156 of FIG. 8. Therefore, as can be seen by FIG. 12 the output for steady state or continuous tones from combination detector of FIG. 9 is identical to the output of the signal detector of FIG. 4. Furthermore, it can be seen that the peak detector output represented by curve 156 dominates on the leading edge of the input step voltages as shown at T1, T6 and the very short transient pulses shown between T11 and T12. Curve 174 of FIG. 12 clearly shows at time period between T11 and T12 very fast detector recovery for the fast transient 150 and 152. Otherwise, substantial distortion on the base notes would be experienced. Furthermore, by careful and proper selection of the parameters of the detectors, very effective cross-coupling between the two detectors can be achieved to prevent fast recovery on the bass transient. For example, if the average time constant of the averaging detector 158 is much less than the bass or low frequency period of a sinusoidal input signal, the output of detector 158 will approximate the instantaneous peak of the signal; i.e. the averaging time of detector 158 is too slow to obtain good averaging for these low frequency signals. For example, an averaging time of approximately 2 milliseconds would provide good averaging for frequency about 100 Hz, but will provide negligable averaging at 20 Hz. Thus averaging detector 158 will dominate the lower frequencies and low distortion on bass transients will be maintained while at the same time Th and Td will remain short enough to handle high frequency transients.

Although in the embodiment of the combination detector illustrated in FIG. 9, both detectors 158 and 160 are of the new and unique design of the inventor, it will be appreciated that a single detector of this invention could be combined with a single detector of a design heretofore available. The output of such a combination detector would still have superior quality with respect to detector previously on the market, but would not perform as well as the combination detector of FIG. 9 when both detectors are of the design of this invention.

FIG. 10 shows a similar combination of averaging detector 158 and instantaneous peak detector 160 connected by means of a summation circuit 176 which provides a final output at 128D. The circuit of FIG. 10 achieves results very similar to that of circuit shown in FIG. 9. As is shown in FIG. 10, the output of average detector 158 and peak detector 160 are provided to amplifier 178 by means of impedances 180 and 182 respectively. Resistor 184 provides a feedback path from the output 128 back to the input of amplifier 178.

FIG. 11 illustrates a combination of detectors wherein the outputs of average detector 158 and peak detector 160 are combined by "OR" circuit 162 and the output at 128C of "OR" circuit 162 is combined with the output 128E of another selected detector circuit 186 by means of a summation circuit 176 to provide a final output at 128F. Depending on the overall needs and purposes of the system, detectors 158, 160 and 186 may be selected as necessary. For example, detector 158 could be an average peak detector, and detector 186 an RMS detector, while detector 160 operates as an instantaneous peak detector. On the other hand, all three detectors could be average peak detectors with different operating characteristics. Similarly, the outputs of the detectors can be combined with an "OR" circuit and a summation circuit as is shown in FIG. 11, or alternatively two "OR" circuits such as is shown at 162 in FIG. 9 and FIG. 11 or two summation circuits such as is shown at 176 in FIG. 10 and FIG. 11 could be used. It should also be appreciated that depending upon the needs of the system, any additional number of selected detectors can be combined by any selected arrangement of "OR" circuits or summation circuits.

Figure 13:
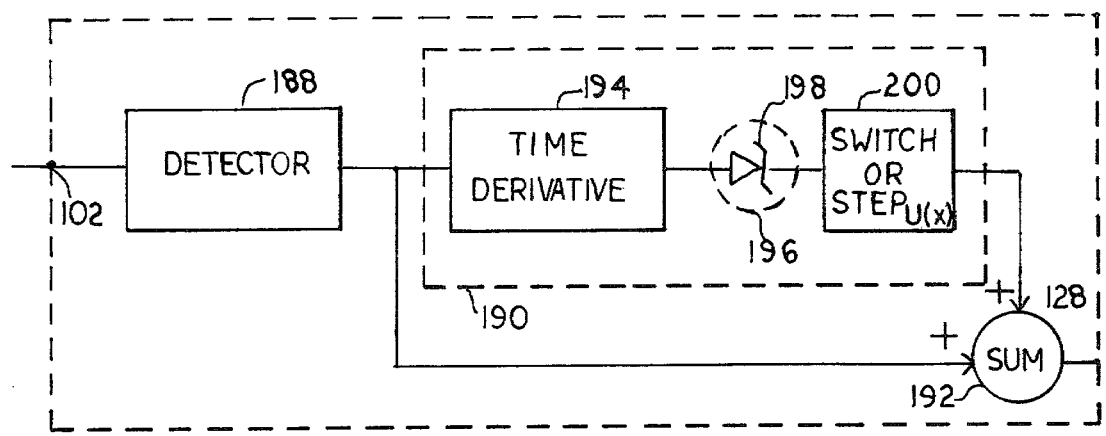
FIG. 13 is another embodiment of the detector of the present invention which includes a "Rate of Change" circuit to achieve greater performance.

In addition to the concept of using two or more detectors for handling a complex signal having fast transients, according to another embodiment of this invention shown at FIG. 13, the signal carrying the fast transients are permitted to pass through the detector of the type shown in FIGS. 4 and 7 designated here as detector 188, where it is then applied to "Rate" circuit 190 for purposes of obtaining a time derivative of the output of detector 188. The output of "Rate" circuit 190 is then combined with the output of detector 188 by means of summing circuit 192 of the type heretofore discussed. In "Rate" circuit 190, the output of detector 188 is applied to time derivative circuit 194, and the output of derivative circuit 194 is then applied to summation circuit 192. In addition to the time derivative circuit 194 of "Rate" circuit 190, it may also be desirable to include threshold circuitry 196 (shown here as zener diode 198) as an element of "Rate" circuit 190 such that the derivative signal will be summed with the output of detector signal 188 by summation circuit 192 only when the derivative signal exceeds a selected threshold value. In the embodiment shown in FIG. 13 the switch or step function generator 200 may be a field effect transistor and may include a detector of the type shown in FIGS. 4 and 7. The detector can be used to reduce ripple in the rate path and can have fast Ta, Th, and Td to allow passage of fast transients with fast recovery. Such rate circuits may be combined with other detectors as illustrated in FIGS. 9, 10 and 11. Thus, rapid gain changes will only occur for fast transient signals.

In this example, it will be appreciated that the threshhold circuit 196 may either be fixed or signal dependent. For example, if the threshhold is proportional to the detector output then rate action will occur for signals having a time derivative greater than a fixed percentage of the detector output. The advantage of this type circuit is that it may be used in compandors that do not require a calibration level.

Figure 14:
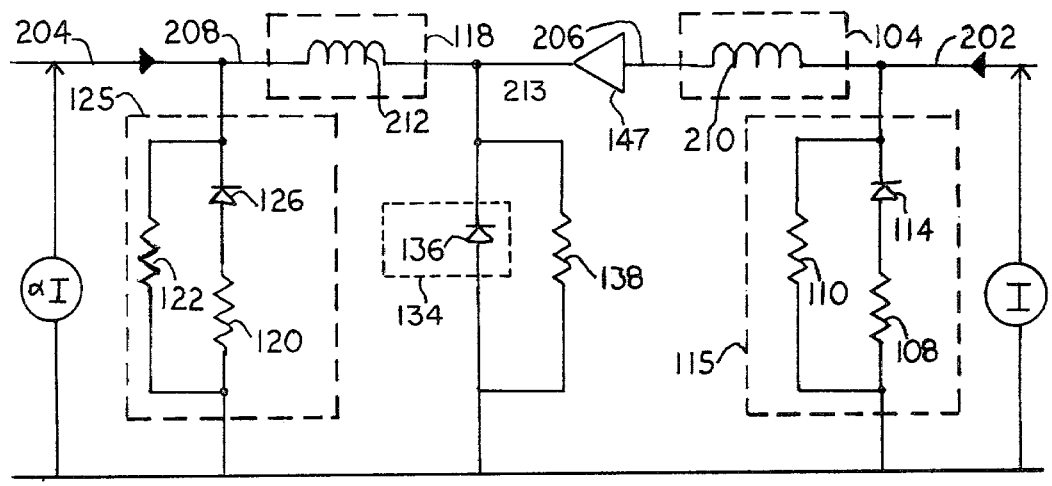
FIG. 14 is the dual equivalent circuit of FIG. 7.

It will be appreciated by those skilled in the art that the various embodiments of detectors discussed above can also be built as a dual circuit. That is, a dual circuit may be built if the currents of voltages are interchanged and the resistance and impedances are changed to conductances and admittances respectively and parallel branches and series branches are interchanged. As an example, FIG. 14 illustrates the "dual" circuitry equivalent of FIG. 7.

The voltages at nodes 102, 130, 103 and 128 shown in FIG. 7 become the currents through branches 202, 204 206 and 208 respectively. Directional conducting circuits 115, 125 and 134 take their positions as shown. In directional conducting circuit 115 resistor 108 is exchanged with resistor 110, and in directional circuit 125 resistor 120 is exchanged with resistor 122. Also note that resistor 138 rather than being in series with diode 136 is now parallel to diode 136. Likewise, memory devices are relocated as is shown and are now illustrated as inductors 210 and 212 respectively. Buffer amplifier 147 is also shown in its new position. If buffer amplifier 147 was selected with a high input impedance and low output impedance in FIG. 7, then in the dual circuit of FIG. 14, it must have low input impedance and high output impedance. Also, since the buffer amplifier of FIG. 7 provides voltage amplification, the dual circuit amplifier of FIG. 14 must provide current amplification. Also, the output current of the buffer amplifier 147 is proportional to the current through memory device 104. The buffer amplifiers are shown here as having zero input impedance and infinite output impedance, (the input impedance is in series with memory device 104 and the output impedance is parallel with diode 136). Note that in FIG. 7 the input impedance is in parallel with memory device 104 and in series with diode 136. Note also that when a diode in FIG. 7 has low resistance, the corresponding dual diode of FIG. 14 has higher resistance and vice a versa. The output of this dual circuit is at 213.

Figure 15:
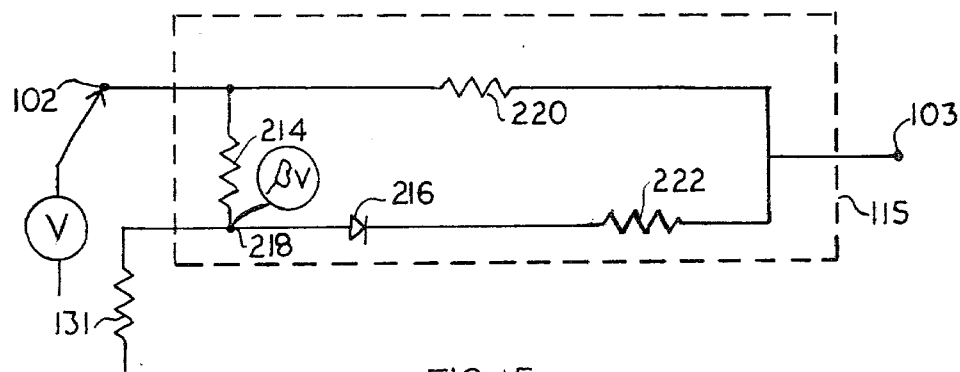
FIG. 15 is a schematic of another arrangement of the elements in the directional conductor circuits of FIG. 4.

Referring again to FIG. 4, the attack time of the detector 100 may be made variable by changes made to the components of circuit 115. For example, circuit 115 as is shown in FIG. 4 may be changed to a new circuit 115 such as that shown in FIG. 15. According to FIG. 15, resistor 214 is inserted in the circuit ahead of unidirectional conductor 216 shown here as a diode. Thus an attenuated voltage $\beta V$ is then applied to unidirectional conductor 216. However, unidirectional conductor 216 will not conduct unless the attenuated input V at point 218 is larger than the output at point 103. Therefore unidirectional conductor 216 will begin to conduct when the input of 102 exceeds output 103 by a preselected proportional amount. The proportional amount is, of course, determined by the attenuation resulting from resistor 124. Exchanging circuit 115 as shown in FIG. 4 for a new circuit 115 shown in FIG. 15 will result in both the attack time and the release time of memory device 104 being determined by resistor 220, unless the change in input is sufficient to cause unidirectional conductor 216 to conduct. Although the previous discussion was with respect to circuit 115, it will be appreciated that a similar effect can be accomplished with respect to circuit 125 with similar changes. If as is shown in FIG. 4, memory devices 104 and 116 are capacitive, then exchanging the circuit of FIG. 15 for circuits 115 or 125 shown in FIG. 4 will yield voltages at 103 and 128 which are proportional to the average value of the voltages at 102 and 130 respectively until the peak-to-average ratio of the voltage at 102 and 130 exceeds the reciprocal of the voltage attenuated by resistor 214. With higher voltages at 102 and 130, the voltages at 103 and 128 will be responsive to the peak value of the voltage applied to 102 and 130.

The attack time of detector 100 can also be made variable by the non-linear characteristics of unidirectional conducting circuits 115 and 125. If a simple diode 126 is used, then the larger the potential difference between points 130 and 128, the the smaller the resistance of diode 126 provided the potential differences forward biases diode 126. Therefore, the larger the change in input level 102 for increasing voltages, the faster the attack time of memory device 116. Diode 112 and memory device 104 behave in a similar fashion.

Either of the two aforementioned methods of achieving variable attack time are useful in compressor, expander and compandor circuits since they reduce the detector sensitivity to low level impulse noise.

The new and unique detectors of this invention, heretofore described, are particularly suitable for operation with compressors, expanders, compandors, limiters, meter movements or any other device having a need for precise AC voltage to DC voltage conversion. The following paragraphs discuss the use of the detector with compressors, expanders, compandors and limiters. In the previous discussion, the manner in which the attach time Ta, the hold time Th and the decay time Td affect the operation of detector was discussed. In addition to these parameters, compressors, expanders and compandors are also controlled by certain general static parameters. These parameters include the compression ratio (CR) which is defined as the change in db of the input needed to cause a change of 1 db B in the output; the expansion ratio (ER) which is defined as the change of db of the output due to a change of 1 db in the input; maximum compression (MC) which is defined as the maximum compressor gain expressed in db; maximum expansion (ME) which is defined as the minimum expander gain expressed in db; and the cross-over point (CP) which is defined as the minimum input level that causes the gain of the compressor to fall toward a minimum. Another parameter is the "threshold" which is defined as the input level that causes the gain of the compressor to begin to decrease. It will be appreciated that in a complimentary system if we provide the Vin as the original signal, Vr is a record signal, and Vo is a playback signal, then the system may be expressed by the following: $Vin = (Vr)^{CR}$ and $Vo = (Vr)^{ER}$. That is, Vin equals Vo. It should be noted however that this equation is for peak, average, or RMS values only and not for instantaneous values.

In a typical compandor, a CR too small will result in little improvement in the dynamic range. On the other hand, a CR too large will result in high sensitivity to gain errors in the recording medium. Also, maximum compression MC, of the circuit along with the attack time Ta plays a major roll in determining transient overshoot of the circuit. Overshoot arrises in the following manner. When the input signal increases in level faster than the attack time Ta, the gain of the compressor cannot decrease fast enough and therefore the signal innitially passes through the compressor with too much amplification which is then followed by a reduction in gain. The larger the maximum compression, MC, is, the larger overshoot can be. It is therefore, desirable to have a limited MC. There is an advantage, however, of reducing source noise by having a limited MC and essentially unlimited ME or maximum expansion. For instance, if no signal is present then the source noise is increased by an amount up to the maximum gain of the compressor, MC. However, upon expansion the compressed noise is reduced by an amount equivalent to the ME or the maximum expansion. Therefore, if ME is greater than MC the apparent souce noise can be reduced by difference ME-MC. Thus, it would be desirable to have a variable MC and a very large ME so that the MC can be set just large enough to pass the dynamic range of the source material but not large enough to unduly amplify the source noise.

As was discussed heretofore, two or more detectors may be combined to provide a combination detector much superior to what could be obtained from a single detector. In a similar manner, even though a wide-band compandor would have many valuable uses, requirements that overshoot and channel overload be minimized, that the circuit accommodate the full dynamic range of the input signals, and that the resulting reproduced signal sound natural may best be accomplished with a multiband compandor. Such a multiband compandor, would reduce distortion, reduce channel overload at high frequencies without excessive pumping, and result in masking of the modulation noise and minimizing of overshoot. A more detailed discussion of these problems and how a multiband compandor helps solve these problems may be found in an article printed in the "Journal of the Audio Engineering Society" by M. G. Duncan (the applicant), D. Rosenberg, and G. W. Hoffman. The article is entitled "Design Criteria of a Universal Compandor for the Elimination of Audible Noise and Tape, Disc and Broadcast Systems" and is in volume 23 No. 8 page 610 of the October, 1975.

Figure 16A:
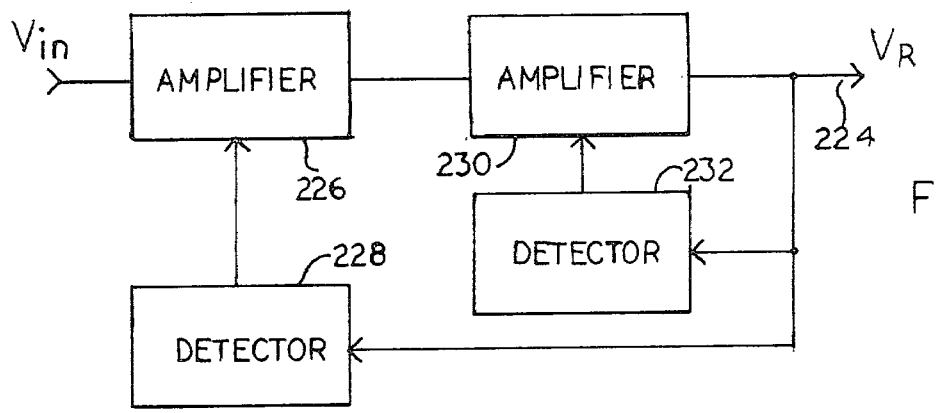
FIGS. 16A and 16B are block diagrams of the compressors and expander stages of a compandor using the detector of this invention.
Figure 16B:
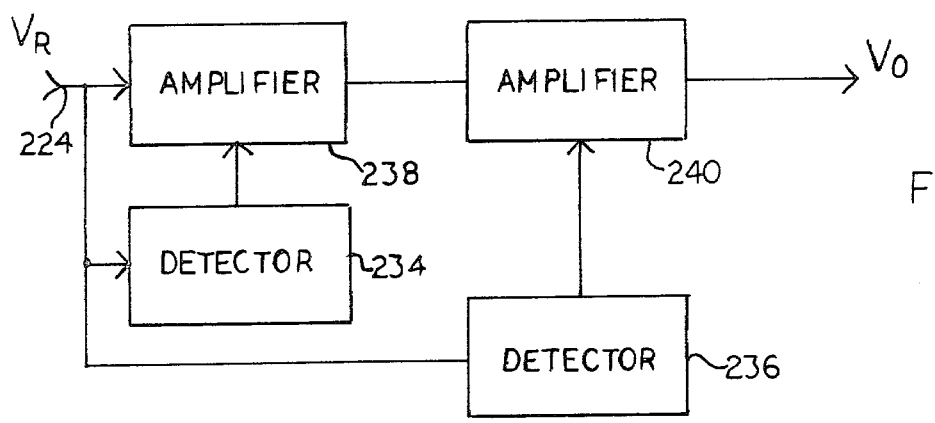

Referring now to FIGS. 16A and 16B, there is shown a block diagram of a typical multiband compandor system. FIG. 16A represents the compression portion of the system and FIG. 16B represents the expander portion. It should also be noted that the output voltage Vr at point 224 on the compression circuit is the same Vr at the input point of the expander circuit. Therefore, the input point which receives Vr of the expander circuit is also labeled 224. It should also be appreciated that the Vr signal from the compressor may be recorded on tape, disc, etc., and then played back to provide the Vr signal at the input of the expander system of FIG. 16B.

As is shown in FIG. 16A, the input signal Vin is applied to variable gain amplifier 226 which is controlled by the output of a new and unique detector 228 of a type which is the subject matter of this application as was described heretofore. The output of variable gain amplifier 226 is then applied to an input of a second variable gain amplifier 230 which is controlled by detector 232. Detector 232 is also new and unique detector of this invention. For purposes of example only, it can be assumed that the compressor is a multiband compressor wherein the combination of detector 228 and varible gain amplifier 226 is responsive to frequencies less than 2 KHz, and the combination of detector 232 and varible gain amplifier 230 are responsive to frequencies greater than 2 KHz. Detectors 228 and 232 are shown in FIG. 16A as a single detector of the type described with respect to FIGS. 4, 7, 13 or 15. However, as was discussed heretofore, each of these detectors could be a combination of two or more of the detectors of FIGS. 4, 7, 13 or 15 according to the techniques set out with respect to FIGS. 9, 10 and 11. The particular selection of one or more detectors and the method of combining the detectors being dependent upon the requirements and the purpose of the circuit. The gain of the compressor of FIG. 16A is the input voltage Vin times gain of the variable gain amplifier 226, GA, times the gain of the variable gain amplifier 230, GB; ie Vr=(GA)(GB)(-Vin).

Since the circuit of FIG. 16B is the expander portion of the compandor system, it will be appreciated that the expander should be exactly complimentary of the compressor of FIG. 16A. This means that detector 234 of the expander is the same as detector 232 of the compressor. Similarly detector 236 is the same as detector 228. The gain of the variable gain amplifiers 238 and 240, however, should be the inverse of the gain of variable gain amplifier 230 and 226 in the compressor, respectively. That is, the gain of variable gain amplifier 240 should be 1/GA, and the gain of variable gain amplifier 238 is the inverse of variable gain amplifier 230 or 1/GB. Consequently, Vo=(1/GA)(1/GB)(VR), and theoretically, in the ideal sense Vo=Vin.

It will also be appreciated that although the compressor unit of FIG. 16A and the expander circuit of FIG. 16B includes two amplifiers and two detectors, a detector and its corresponding amplifier could be omitted from both the compressor and the expander circuit. For example, detector 232 and amplifier 230 could be omitted from the compressor of FIG. 16A, or detector 234 and amplifier 238 could be omitted from the expander circuit of 16B.

If a multiband compandor system is not required, then one of the variable gain amplifiers and detector combination in the compressor of FIG. 16A could be used as a limiter. In such an embodiment, the complimentary detector and varible gain amplifier combination of FIG. 16B should be omitted since those portions of the signal loss due to limiting cannot be recovered by simply adding another stage in the expandor portion of the circuitry.

Figure 17:
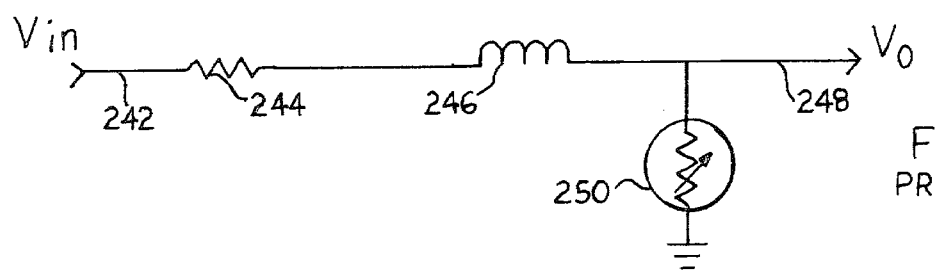
FIG. 17 is a schematic of a control element of a simple variable gain amplifier suitable for use in this invention.

It will be appreciated that almost any standard design of variable gain amplifier can be used in the compandor system described in this embodiment. Accordingly, FIG. 17 illustrates one version of a very simple voltage or signal controlled variable attenuator which is suitable for use. The input signal is received at input point 242 where it passes through resistor 244, and inductor 246. The variable output of the attenuator at point 248 is also connected to ground by means of a variable resistor 250. Variable resistor 250 may for example be a photoconductor illuminated by an LED (light emitting diode) or an FET (field effect transistor).

Figure 18:
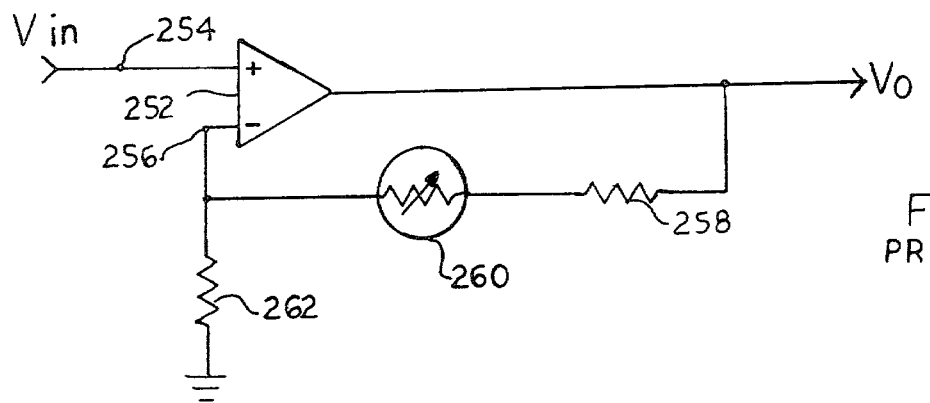
FIG. 18 is a schematic of another variable gain amplifier suitable for use in this invention.

FIG. 18 illustrates still another variable gain amplifier suitable for use with either the compressor or expander portions of a compandor. In this example the input voltage is applied to operational amplifier 252 at the noninverting input point 254. An inverting input to operational amplifier 252 is at 256. Feedback is then provided through resistor 258 and variable resistor 260 to second input point 256. As was the case with the amplifier of FIG. 17, variable resistor 260 may be an FET or a photoconductor illuminated by an LED. Resistance 262 maintains a reference to ground for input 256.

Therefore, while what have been described are at present considered to be preferred embodiments of this invention, it will be obvious to those skilled in the art that various changes and modifications may be made therein without departing from the invention, and the invention is therefore, intended to cover all of its changes and modifications as are in the true spirit and scope of the invention.

I claim:

1. A detector responsive to an input primary electrical source signal for controlling the conversion of an AC signal to a DC signal comprising:
    first memory means for continuously receiving and storing input signals;
    a first directional conducting circuit for providing said input signals to said first memory means, said first directional conducting circuit being connected between a primary input point for receiving said primary electrical source signal and said first memory means and comprising a first unidirectional conductor in electrical parallel arrangement with a first resistive element;
    second memory means for continuously receiving and storing input signals, said second memory means including an output point for providing an output signal representative of the stored signal value of said second memory means;
    a second directional conductor circuit for providing said input signals to said second memory means, said second directional conducting circuit for receiving a secondary electrical source signal and being connected between a secondary input point and said second memory means, and comprising a second unidirectional conductor in electrical parallel arrangement with a second resistive element; and
    a third unidirectional conductor for providing an interaction path between said first and second memory means, said third unidirectional conductor being connected between said second memory means and said first memory means such that;
    whenever the stored signal value of said first memory means is at least equal to the stored signal value of said second memory means, said third unidirectional conductor does not conduct and the stored signals values of said first and second memory means are substantially independent of each other and vary substantially only in response to changes in said input signals provided to said first and second memory means, respectively, as they discharge according to their respective time constants, and whenever said primary electrical source signal is less than the stored value of said second memory means and said stored signal value of said first memory means decreases to a value substantially equal to the stored value of said second memory means, said third uniconductor conducts and the stored signal values of said first and second memory means vary in a similar manner and are substantially equal as they both discharge according to a combined time constant.

2. The detector of claim 1 and further comprising a third resistive element connected between one of said primary input point and said first unidirectional conductor, and said secondary input point and said second unidirectional conductor.

3. The detector of claim 1 and further comprising a third resistive element connected between said primary input point and said first unidirectional conductor and a fourth resistive element connected between said secondary input point and said second unidirectional conductor.

4. The detector of claim 1 wherein said second directional conducting circuit further comprises a third resistive element in electrical series arrangement with said second unidirectional conductor and said second resistive element is in electrical parallel arrangement with said second unidirectional conductor and said third resistive element.

5. The detector of claim 1 and further comprising a buffer amplifier connected between said first memory means and said third unidirectional conductor, said buffer amplifier for obtaining a combined decay rate of said first and second memory means which is substantially equal to the independent decay rate of said first memory means whenever said first memory means drops to a value equal to or less than said second memory means.

6. The detector of claim 1 and further comprising a third resistive element connected between said primary input point and said first directional conducting circuit.

7. The detector of claim 1 and further comprising a third resistive element connected between said secondary input point and said second directional conducting circuit.

8. The detector of claim 1 and further comprising a third resistive element connected between said primary input point and said first directional conducting circuit, and a fourth resistive element connected between said secondary input point and said second directional conducting circuit.

9. The detector of claim 1 wherein said first directional conducting circuit further comprises a third resistive element in electrical series arrangement with said first unidirectional conductor, and said first resistive element is in electrical parallel arrangement with said first unidirectional conductor and said third resistive element.

10. The detector of claim 9 wherein said second directional conducting circuit further comprises a fourth resistive element in electrical series arrangement with said second unidirectional conductor and said second resistive element is in electrical parallel arrangement with said second unidirectional conductor and said fourth resistive element.

11. A detector responsive to an input primary electrical source signal for controlling the conversion of an AC signal to a DC signal comprising:

first memory means for continuously receiving and storing input signals;

a first directional conducting circuit for controlling said input signal to said first memory means, said first directional conducting circuit being connected between a primary input point for receiving said primary electrical source signal and ground and comprising a first unidirectional conductor in electrical series arrangement with a first resistive element;

second memory means for continuously receiving and storing input signals said second memory means including an output point for providing an output signal representative of the stored value of said second memory means;

a second conducting circuit for controlling said input signal to said second memory means, said second directional conducting circuit for receiving a secondary electrical source signal and being connected between a secondary input point and ground, and comprising a second unidirectional conductor in electrical series arrangement with a second resistive element; and a third unidirectional conductor for providing interaction between said first and second memory means, one end of said third unidirectional conductor being connected between said second memory means and said first memory means and the other end being connected to ground, such that;

whenever the stored signal value of said first memory means is at least equal to the stored signal value of said second memory means, said stored signal values of said first and second memory means are substantially independent of each other and vary substantially only in response to changes in said input signals provided to said first and second memory means, respectively; and whenever said primary electrical source signal is less than the stored value of said second memory means and said stored value of said first memory means decreases to a value substantially equal to the stored value of said second memory means, said stored values of said first and second memory means vary in a similar manner and are substantially equal.

12. The detector of claims 1, 10, or 11 wherein said primary electrical source signal is a combination of signals from a multiplicity of sources.

13. The detector of claims 1, 10 or 11 wherein said secondary electrical source signal is proportional to said primary electrical source signal.

14. The detector of claims 1 or 10 wherein said one of said first and second, memory means includes a capacitive element.

15. The detector of claims 1 or 10 wherein both of said first and second memory means includes a capacitive elements.

16. The detector of claim 1, 10 or 11 and further comprising a first voltage dividing resistive element connected between said primary input point and said secondary input point, and a second voltage dividing resistive element connected between said second input point and ground such that said secondary electrical source signal is proportional to and smaller than said primary electrical source signal.

17. The detector of claims 1, 10 or 11 and further comprising:

means connected to said output point of said detector for providing a time derivative signal representative of the rate of change of the output signal from said detector; and combining means connected to said output point of said detector and the output of said time derivative means for receiving said detector output signal and said time derivative signal for providing a resultant output signal representative of the combined value of said time derivative signal and said detector output signal.

18. The detector of claim 17 wherein said time derivative means includes a threshold circuit such that said time derivative signal is provided to said combining means only if said time derivative signal exceeds a preselected value.

19. A multistage detector responsive to an input primary electrical source signal for controlling the conversion of AC signals to DC signals comprising:

A multiplicity of detector stages, at least one stage comprising, first memory means for continuously receiving and storing input signals;

a first directional conducting circuit for providing said input signals to said first memory means said first directional conducting circuit being connected between a primary input point for receiving said primary electrical source signal and said first memory means and comprising a first unidirectional conductor in electrical parallel arrangement with a first resistive element;

second memory means for continuously receiving and storing input signals, said second memory means including an output point for providing an output signal representative of the stored signal value of said second memory means;

a second directional conductor circuit for providing said input signals to said second memory means, said second directional conducting circuit for receiving a secondary electrical source signal and being connected between a secondary input point and said second memory means, and comprising a second unidirectional conductor in electrical parallel arrangement with a second resistive element; and a third unidirectional conductor for providing an interaction path between said first and second memory means, said third unidirectional conductor being connected between said second memory means and said first memory means such that;

whenever the stored signal value of said first memory means is at least equal to the stored signal value of said second memory means, said third unidirectional conductor does not conduct and the stored signal values of said first and second memory means are substantially independent of each other and vary substantially only in response to changes in said input signals provided to said first and second memory means, respectively, as they discharge according to their respective time constants, and whenever said primary electrical source signal is less than the stored value of said second memory means and said stored signal value of said first memory means decreases to a value substantially equal to the stored value of said second memory means, said third uniconductor conducts and the stored signal values of said first and second memory means vary in a similar manner and are substantially equal as they both discharge according to a combined time constant; and combining means connected to the output point of each of said detector stages for receiving the output signals from each of said detector stages and for providing a resultant output signal representative of the combined output signals.

20. A multistage detector responsive to an input primary electrical source signal for controlling the conversion of an AC signal to a DC signal comprising:

a multiplicity of detector stages, at least one stage comprising, first memory means for continuously receiving and storing input signals, a first directional conducting circuit for controlling said input signal to said first memory means, said first directional conducting circuit being connected between a primary input point for receiving said primary electrical source signal and ground and comprising a first unidirectional conductor in electrical series arrangement with a first resistive element;

second memory means for continuously receiving and storing input signal said second memory means including an output point for providing an output signal representative of the stored value of said second memory means;

a second directional conducting circuit for controlling said input signal to said second memory means, said second directional conducting circuit for receiving a secondary electrical source signal and being connected between a secondary input point and ground, and comprising a second unidirectional conductor in electrical series arrangement with a second resistive element; and a third unidirectional conductor for providing interaction between said first and second memory means, one end of said third unidirectional conductor being connected between said second memory means and said first memory means and the other end being connected to ground, such that;

whenever the stored signal value of said first memory means is at least equal to the stored signal value of said second memory means, said stored signal values of said first and second memory means are substantially independent of each other and vary substantially only in response to changes in said input signals provided to said first and second memory means, respectively;

whenever said primary electrical source signal is less than the stored value of said second memory means and said stored value of said first memory means decreases to a value substantially equal to the stored value of said second memory means, said stored values of said first and second memory means vary in a similar manner and are substantially equal; and combining means connected to the output point of each of said detector stages for receiving said output signals and for providing a resultant output signal representative of the combined output signals.

21. The multistage detector of claim 19 or 20, wherein said combining means is an analog "OR" circuit.

22. The multistage detector of claim 19 or 20, wherein said combining means is a summation circuit.

23. The multistage detector of claim 19, 20 or 22 wherein at least one of said stages is an averaging detector responsive to a selected averaged value of the primary electrical source signal, and at least one of the detector stages is responsive to the instantaneous peak value of the primary electrical source signal.

24. Circuitry for compressing the dynamic range of an electrical intelligence signals comprising:
  a variable gain amplifier responsive to a control signal, said variable gain amplifier having a compressor circuit input for receiving an electrical intelligence signal and a compressor circuit output for providing a primary electrical source signal with a compressed dynamic range; and
  a detector responsive to said primary electrical source signal for providing said control signal to control said variable gain amplifier comprising,
    first memory means for continuously receiving and storing input, signals,
    a first directional conducting circuit for providing said input signal to said first memory means, said first directional conducting circuit for receiving said primary electrical source signal and being conducted between said compressor circuit output and said first memory means and comprising a first unidirectional conductor in electrical parallel arrangement with a first resistive element,
    second memory means for continuously receiving and storing input signals, said second memory means including an output point for providing said control signal representative of the stored signal value of said second memory means,
    a second directional conductor circuit for providing said input signals to said second memory means, said second directional conducting circuit for receiving a secondary electrical source signal and being connected between a secondary input point and said second memory means, and comprising a second unidirectional conductor in electrical parallel arrangement with a second resistive element,
    means for providing said secondary electrical source signal to said secondary input point, said secondary source signal being proportional to said primary electrical source signal, and
    a third unidirectional conductor for providing an interaction path between said first and second memory means, said third unidirectional conductor being connected between said second memory means and said first memory means such that;
    whenever the stored signal value of said first memory means is at least equal to the stored signal value of said second memory means, said third unidirectional conductor does not conduct and the stored signal values of said first and second memory means are substantially independent of each other and vary substantially only in response to changes in said input signals provided to said first and second memory means, respectively, as they discharge according to their respective time constants, and
    whenever said primary electrical source signal is less than the stored value of said second memory means and said stored signal value of said first memory means decreases to a value substantially equal to the stored value of said second memory means, said third uniconductor conducts and the stored signal values of said first and second memory means vary in a similar manner and are substantially equal as they both discharge according to a combined time constant.

25. Circuitry for expanding the dynamic range of an electrical intelligence signal comprising:
  a variable gain amplifier responsive to a control signal, said variable gain amplifier having an expander circuit input for receiving an electrical intelligence signal and an expander circuit output for providing a primary electrical source signal with an expanded dynamic range; and
  a detector responsive to said electrical intelligence signal for providing said control signals to control said variable gain amplifier comprising;
    first memory means for continuously receiving and storing input signals,
    a first directional conducting circuit for providing said input signals to said first memory means, said first directional conducting circuit for receiving said electrical intelligence signal and being connected between said expander circuit input and said first memory means and comprising a first unidirectional conductor in electrical parallel arrangement with a first resistive element,
    a second memory means for continuously receiving and storing input signals, said second memory means including an output point for providing said control signal representative of the stored signal value of said second memory means,
    second directional conductor circuit for providing said input signals to said second memory means, said second directional conducting circuit for receiving a modified electrical intelligence signal and being connected between a secondary input point and said second memory means, and comprising a second unidirectional conductor in electrical parallel arrangement with a second resistive element,
  means for providing said modified electrical intelligence signal to said secondary input point, said modified electrical intelligence signal being proportional to said electrical intelligence signal; and
  a third unidirectional conductor for providing an interaction path between said first and second memory means, said third unidirectional conductor being connected between said second memory means and said first memory means such that;
    whenever the stored signal value of said first memory means is at least equal to the stored signal value of said second memory means, said third unidirectional conductor does not conduct and the stored signal values of said first and second memory means are substantially independent of each other and vary substantially only in response to changes in said input signals provided to said first and second memory means, respectively, as they discharge according to their respective time constants, and
    whenever said electrical intelligence is less than the stored value of said second memory means and said stored signal value of said first memory means decreases to a value substantially equal to the stored value of said second memory means, said third uniconductor conducts and the stored signal values of said first and second memory means vary in a similar manner and are substantially equal as they both discharge according to a combined time constant.

26. A compander circuit for compressing and expanding the dynamic range of an electrical intelligence signal comprising:
a first variable gain amplifier responsive to a first control signal, said first variable gain amplifier having a a compressor input point for receiving an electrical intelligence signal and a compressor circuit output for providing a first primary electrical source signal with a compressed dynamic range;
a first detector responsive to said first primary electrical source signal for providing said first control signal to control said first variable gain amplifier, said first detector comprising,
first memory means for continuously receiving and storing input signals,
a first directional conducting circuit for providing said input signals to said first memory means, said first directional conducting circuit for receiving said first primary electrical source signal and being connected between said compressor circuit output and said first memory means and comprising a first unidirectional conductor in electrical parallel arrangement with a first resistive element,
second memory means for continuously receiving and storing input signals, said second memory means including means for providing said first control signal representative of the stored signal value of said second memory means,
a second directional conductor circuit for providing said input signals to said second memory means, said second directional conducting circuit for receiving a first secondary electrical source signal and being connected between a first secondary input point and said second memory means, and comprising a second unidirectional conductor in electrical parallel arrangement with a second resistive element,
means for providing said first secondary electrical source signal to said first secondary input point, said first secondary source signal being proportional to said first primary electrical source signal, and
a third unidirectional conductor for providing an interaction path between said first and second memory means, said third unidirectional conductor being connected between said second memory means and said first memory means such that;
whenever the stored signal value of said first memory means is at least equal to the stored signal value of said second memory means, said third unidirectional conductor does not conduct and the stored signal values of said first and second memory means are substantially independent of each other and vary substantially only in response to changes in said input signals provided to said first and second memory means, respectively as they discharge according to their respective time constants, and
whenever said primary electrical source signal is less than the stored value of said second memory means and said stored signal value of said first memory means decreases to a value substantially equal to the stored value of said second memory means, said third uniconductor conducts and the stored signal values of said first and second memory means vary in a similar manner and are substantially equal as they both discharge according to a combined time constant;
a second variable gain amplifier responsive to a second control signal, said second variable gain amplifier having an expander input point for receiving said first primary electrical source signal and an expander circuit output for providing a second primary electrical source signal with an expanded dynamic range; and
a second detector responsive to said first primary electrical source signal for providing said second control signal to control said second variable gain amplifier, said second detector comprising;
third memory means for continuously receiving and storing input signals,
a third directional conducting circuit for providing said input signals to said third memory means, said third directional conducting circuit for receiving said first primary electrical source signal and being connected between said expander circuit input and said third memory means and comprising a fourth unidirectional conductor in electrical parallel arrangement with a third resistive element,
fourth memory means for continuously receiving and storing input signals, said fourth memory means including means for providing said second control signal representative of the stored signal value of said fourth memory means;
a fourth directional conductor circuit for providing said input signals to said fourth memory means, said fourth directional conducting circuit for receiving a second secondary electrical source signal and being connected between a second secondary input point and said second memory means, and comprising a fifth unidirectional conductor in electrical parallel arrangement with a fourth resistive element,
means for providing said second secondary electrical source signal to said second secondary input point, said second secondary source signal being proportional to said first primary electrical source signal, and
a sixth unidirectional conductor for providing an interaction path between said third and fourth memory means, said sixth directional conductor being connected between said fourth memory means and said third memory means such that;
whenever the stored signal value of said third memory means is at least equal to the stored signal value of said fourth memory means said sixth unidirectional conductor does not conduct and the stored signal values of said third and fourth memory means are substantially independent of each other and vary substantially only in response to changes in said input signals provided to said third and fourth memory means respectively as they discharge according to their respective time constants, and
whenever said first primary source signal is less than the stored value of said fourth memory means and said stored signal value of said third memory means decreases to a value substantially equal to the stored value of said fourth memory means, said sixth uniconductor conducts and the stored signal values of said third and fourth memory means vary in a similar manner and are substantially equal as they both discharge according to a combined time constant.

* * * * *